(12) United States Patent
Wood

(10) Patent No.: US 9,208,264 B2
(45) Date of Patent: *Dec. 8, 2015

(54) METHOD FOR SEMI-AUTOMATIC QUANTITY TAKEOFF FROM COMPUTER AIDED DESIGN DRAWINGS

(75) Inventor: Andrew Wood, San Francisco, CA (US)

(73) Assignee: AUTODESK, Inc., San Rafael, CA (US)

( * ) Notice: Subject to any disclaimer, the term of this patent is extended or adjusted under 35 U.S.C. 154(b) by 797 days.

This patent is subject to a terminal disclaimer.

(21) Appl. No.: 11/852,846

(22) Filed: Sep. 10, 2007

(65) Prior Publication Data

US 2009/0070071 A1 Mar. 12, 2009

(51) Int. Cl.
*G06F 17/50* (2006.01)

(52) U.S. Cl.
CPC .................................. *G06F 17/5004* (2013.01)

(58) Field of Classification Search
USPC ................................................ 703/1; 705/29
See application file for complete search history.

(56) References Cited

U.S. PATENT DOCUMENTS

| | | | |
|---|---|---|---|
| 5,189,606 A | 2/1993 | Burns et al. | |
| 5,625,827 A | 4/1997 | Krause et al. | |
| 5,907,850 A | 5/1999 | Krause et al. | |
| 6,324,508 B1 | 11/2001 | Finny | |
| 6,658,387 B2 | 12/2003 | Finny | |
| 6,922,701 B1 | 7/2005 | Ananian et al. | |
| 7,283,975 B2 | 10/2007 | Broughton | |
| 7,720,703 B1 | 5/2010 | Broughton | |
| 2001/0037190 A1* | 11/2001 | Jung | 703/1 |
| 2004/0205519 A1 | 10/2004 | Chapel et al. | |
| 2005/0203718 A1 | 9/2005 | Carek et al. | |
| 2005/0261930 A1 | 11/2005 | Litz | |
| 2006/0044307 A1 | 3/2006 | Song | |
| 2007/0192677 A1 | 8/2007 | O'Leary | |
| 2008/0004844 A1 | 1/2008 | Kefford et al. | |
| 2008/0015823 A1 | 1/2008 | Arnold et al. | |
| 2008/0269942 A1 | 10/2008 | Free | |
| 2009/0030835 A1 | 1/2009 | Burns et al. | |
| 2009/0070071 A1 | 3/2009 | Wood | |
| 2009/0070072 A1 | 3/2009 | Wood | |
| 2009/0070073 A1 | 3/2009 | Wood | |

(Continued)

OTHER PUBLICATIONS

International Search Report. Nov. 7, 2008.

(Continued)

*Primary Examiner* — Saif Alhija
(74) *Attorney, Agent, or Firm* — Artegis Law Group, LLP

(57) ABSTRACT

Embodiments of the present invention include methods for semi-automatic quantity takeoff from computer aided design (CAD) drawings. For each drawing object a corresponding takeoff object is created. A takeoff object may include the dimension of geometry (e.g., numerical, lineal, area) to quantify, the object parameter to be quantified for all instances of the object, and the takeoff calculations to be performed. After a takeoff object is defined, the corresponding instances are automatically identified and quantified. The cost of each instance is then calculated and added to the project cost. Using automated methods, instead of manual techniques, reduces errors and increases the accuracy of the generated cost estimate. Advantageously, the takeoff objects may be saved in the system database and reused for different projects, thereby ensuring consistency between projects. Furthermore, reusing takeoff information, both between instances of an object and between projects, reduces the time required to perform cost estimates.

15 Claims, 11 Drawing Sheets

Takeoff Report 600

| Description | Quantity... | Material Cost | | Labor Cost | | Equipme... | Total |
|---|---|---|---|---|---|---|---|
| | | Unit Cost | Total | Unit Cost | Total | | |
| Basic Wall | 18.97 m | $20.00 | $379.40 | $10.00 | $189.70 | $0.00 | $569.10 |
| Basic Wall [124680] | 2.47 m | $20.00 | $49.40 | $10.00 | $24.70 | $0.00 | $74.10 |
| Basic Wall [124133] | 10.00 m | $20.00 | $200.00 | $10.00 | $100.00 | $0.00 | $300.00 |
| Basic Wall [109872] | 5.50 m | $20.00 | $110.00 | $10.00 | $55.00 | $0.00 | $165.00 |
| Basic Wall [221079] | 1.00 m | $20.00 | $20.00 | $10.00 | $10.00 | $0.00 | $30.00 |
| Door #1 | 1 EA | $34.00 | $34.00 | $14.00 | $14.00 | $0.00 | $48.00 |
| Door #1 [354621] | 1 EA | $34.00 | $34.00 | $14.00 | $14.00 | $0.00 | $48.00 |
| Project Total | | | $413.40 | | $203.70 | $0.00 | $617.10 |

Description 602
Quantity 604
Material Cost 606
Labor Cost 608
Equipment Cost 610
Total Cost 612

(56) References Cited

U.S. PATENT DOCUMENTS

2009/0198539 A1   8/2009  Buzz
2010/0023432 A1   1/2010  Wood

OTHER PUBLICATIONS

Office Action dated Aug. 12, 2010, U.S. Appl. No. 12/181,269.
Office Action in U.S. Appl. No. 12/138,318, mailed Nov. 22, 2010.

* cited by examiner

Takeoff Report
600

| Description | Quantity... | Material Cost | | Labor Cost | | Equipme... | Total |
|---|---|---|---|---|---|---|---|
| | | Unit Cost | Total | Unit Cost | Total | | |
| Basic Wall | 18.97 m | $20.00 | $379.40 | $10.00 | $189.70 | $0.00 | $569.10 |
| Basic Wall [124680] | 2.47 m | $20.00 | $49.40 | $10.00 | $24.70 | $0.00 | $74.10 |
| Basic Wall [124133] | 10.00 m | $20.00 | $200.00 | $10.00 | $100.00 | $0.00 | $300.00 |
| Basic Wall [109872] | 5.50 m | $20.00 | $110.00 | $10.00 | $55.00 | $0.00 | $165.00 |
| Basic Wall [221079] | 1.00 m | $20.00 | $20.00 | $10.00 | $10.00 | $0.00 | $30.00 |
| Door #1 | 1 EA | $34.00 | $34.00 | $14.00 | $14.00 | $0.00 | $48.00 |
| Door #1 [354621] | 1 EA | $34.00 | $34.00 | $14.00 | $14.00 | $0.00 | $48.00 |
| Project Total | | | $413.40 | | $203.70 | $0.00 | $617.10 |

Description 602 | Quantity 604 | Material Cost 606 | Labor Cost 608 | Equipment Cost 610 | Total Cost 612

METHOD FOR SEMI-AUTOMATIC QUANTITY TAKEOFF FROM COMPUTER AIDED DESIGN DRAWINGS

BACKGROUND OF THE INVENTION

1. Field of the Invention

The present invention generally relates to computer software. More specifically, the present invention relates to techniques for generating quantity takeoff data from computer aided design drawings.

2. Description of the Related Art

The term computer aided design (CAD) generally refers to a broad variety of computer-based tools used by architects, engineers, and other construction and design professionals. CAD applications may be used to construct computer models representing virtually any real-world construct. Commonly, CAD applications are used to compose computer models and drawings related to construction projects. For example, a CAD application may be used to compose a three-dimensional (3D) model of a house or an office building. Once composed, these CAD models are often used to generate a variety of two-dimensional (2D) and 3D views such as plan, profile, section, and elevation views. Additionally, such models may be used to generate architectural, construction, engineering, and other documentation related to the construction project.

A common requirement of construction projects is to generate an estimate of the cost of the project from the building drawings. This estimate can then be used as part of the bidding process or as part of the pricing process. The term "quantity takeoff" is generally referred to as the process of generating such an estimate. Typically, quantity takeoff involves identifying the quantity of the items associated with the construction project, determining the associated materials and labor costs, and generating an estimate of the cost of the project. Quantities may include numerical counts, such as the number of doors and windows in a project, but may also include other quantities such as the volume of concrete or the lineal feet of wall space.

Today, the quantity takeoff process is typically performed manually. For example, a project manager may use a printout, a pen, and a clicker to manually count objects depicted in a set of construction documents. The project manager may physically mark each instance of an object in a CAD drawing, using the clicker to maintain an instance count. A digitizer is often used for taking measurements from the printout. The project manager or cost engineer evaluates each drawing element individually, identifies the material associated with the element, identifies and quantifies the appropriate dimension of the element, calculates the element cost, and adds the element cost to the overall cost estimate.

One drawback to this approach is that it has proven to be error-prone. Also, this approach is both labor intensive and time consuming. Moreover, if the project design is modified after the original cost estimate is calculated, the takeoff process may need to be repeated. If the takeoff process is not repeated after design changes, accumulated inaccuracies in the cost estimate may adversely affect the bidding or pricing process. Another drawback to this approach is that it is difficult and expensive to accurately assess the cost impact of different design choices.

As the foregoing illustrates, what is needed in the art is a more effective and flexible technique for estimating the cost of a construction project. That is, for more effective and flexible techniques for generating quantity takeoff data.

SUMMARY OF THE INVENTION

Embodiments of the present invention include methods for semi-automatic quantity takeoff from computer aided design (CAD) drawings. For each drawing object a corresponding takeoff object is created. A takeoff object may include a dimension (e.g., numerical, lineal, area, or volume) to quantify, the object parameter to be quantified for all instances of the object, and the takeoff calculations to be performed. After a takeoff object is defined, the corresponding instances are automatically identified and quantified. The cost of each instance is then calculated and added to the project cost. Using automated methods, instead of manual techniques, reduces errors and increases the accuracy of the generated cost estimate. Advantageously, the takeoff objects may be saved in the system database and reused for different projects, thereby ensuring consistency between projects. Furthermore, reusing takeoff information, both between instances of an object and between projects, reduces the time required to perform cost estimates.

In a first embodiment, the user selects an instance of an object and defines an associated takeoff object. The quantity takeoff engine is configured to use the information in this takeoff object to identify all associated instances in the CAD drawing, quantify these instances, calculate the cost of these instances, and add the quantities and costs to the takeoff report. The user may continue to select objects until all instances in the project have been quantified, thereby generating an estimate for the total project cost. Advantageously, the takeoff measurement tools automatically quantify each instance, thereby increasing the accuracy of the measurements as compared to manual techniques, such as using a digitizer. Moreover, the takeoff calculations, such as labor cost equations, are also performed automatically, further reducing the likelihood of errors in the project cost estimate.

In a second embodiment, the information in the CAD drawing is used to create a takeoff tree of undefined takeoff objects and associated instances. Every instance in the CAD drawing is included in the takeoff tree. The quantity takeoff engine evaluates the takeoff tree and prompts the user to define takeoff objects until all of the takeoff objects have been defined. After each takeoff object is defined, the quantity takeoff engine applies the information in the takeoff object to the associated instances in the takeoff tree to generate quantity and cost information for the associated instances. These quantities and costs are added to the takeoff report. Thus, when all takeoff objects have been defined, the takeoff report includes the quantity and cost of each instance in the CAD drawing. In addition to the advantages of the first embodiment, this embodiment also ensures that all instances are quantified. For example, in the first embodiment, it is possible for the user to neglect to select an instance, resulting in an inaccurate project cost estimate. In this second embodiment, the user is prompted if any takeoff objects are undefined, thereby ensuring a complete project cost estimate.

In a third embodiment, the quantity takeoff engine is configured to interact with a system database that may contain takeoff objects. The quantity takeoff engine evaluates each instance in the CAD drawing and attempts to map each instance to a corresponding takeoff object in the system database. If there are any instances that are not mapped to a takeoff object, the user is prompted to define additional takeoff objects. The new takeoff objects are added to the system database and the quantity takeoff engine attempts to map the previously unmapped instances to the newly defined takeoff objects. When all instances are successfully mapped, the information in the takeoff objects is used to quantify each instance and subsequently calculate the cost of each instance. These quantities and costs are used to generate a takeoff report for the entire CAD drawing, and thereby a complete estimate of project cost. Advantageously, utilizing the system database in this fashion allows takeoff objects to be shared amongst projects, thereby increasing consistency between projects. Furthermore, as projects are completed, the system database increases in capability. Over time, the creation of new takeoff objects decreases as the system database becomes more complete, thereby reducing the time required to perform takeoff.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
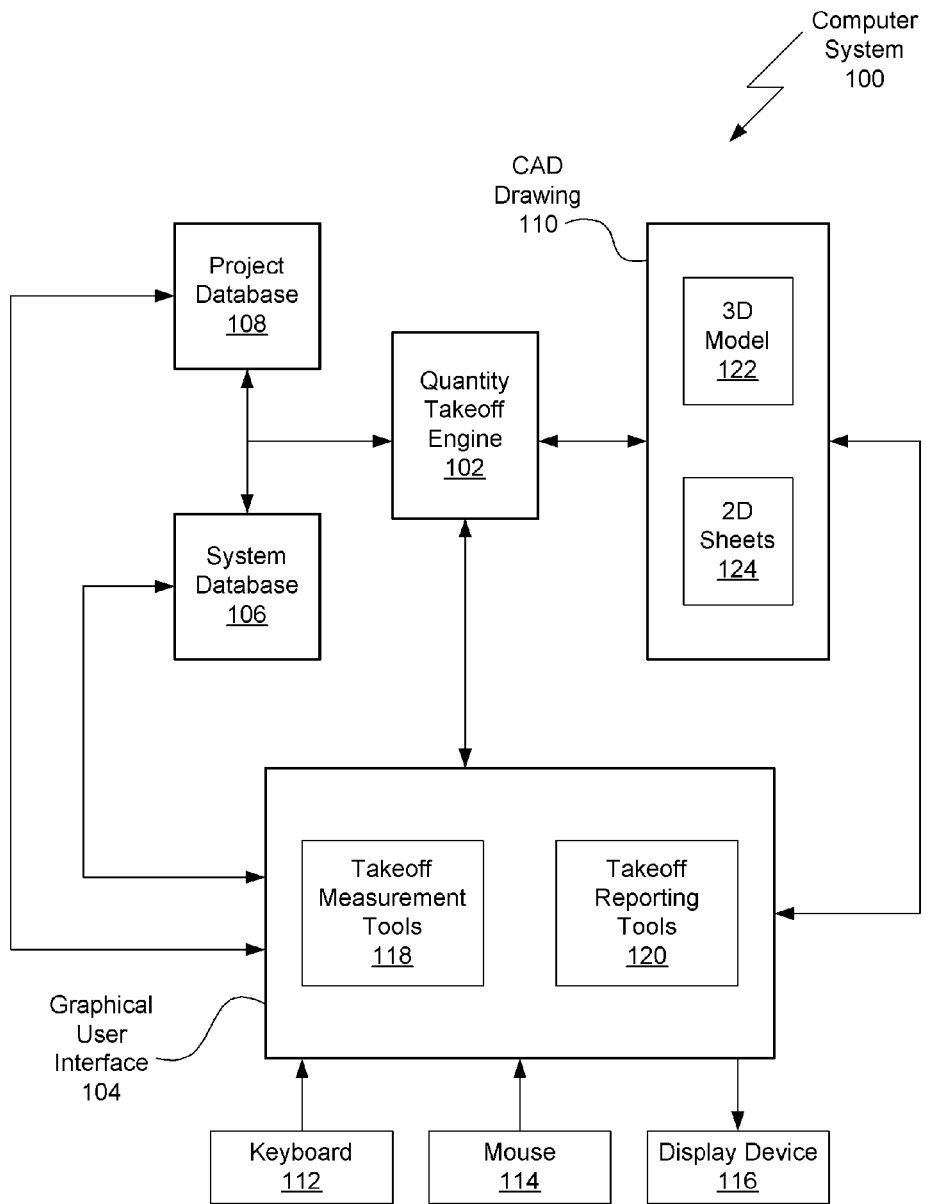
FIG. 1 is a conceptual illustration of a computer system in which embodiments of the invention may be implemented.

FIG. 1 is a conceptual illustration of a computer system 100 in which embodiments of the invention may be implemented. As shown, the computer system 100 is configured to store takeoff data, perform takeoff measurements, and generate takeoff reports. In one embodiment, the components illustrated in computer system 100 include computer software applications executing on existing computer systems, e.g., desktop computers, server computers, laptop computers, tablet computers, and the like. The software applications described herein, however, are not limited to any particular computing system and may be adapted to take advantage of new computing systems as they become available.

Additionally, the components illustrated in computer system 100 may be software applications executing on distributed systems communicating over computer networks including local area networks or large, wide area networks, such as the Internet. For example, a graphical user interface 104 may include a software program executing on a client computer system communicating with a quantity takeoff engine 102. Also, in one embodiment, the quantity takeoff engine 102 and the graphical user interface 104 may be provided as an application program (or programs) stored on computer readable media such as a CD-ROM, DVD-ROM, flash memory module, or other tangible storage media.

As shown, the computer system 100 includes, without limitation, the quantity takeoff engine 102, the graphical user interface 104, a keyboard 112, a mouse 114, a display device 116, a system database 106, a project database 108, and a CAD drawing 110. The quantity takeoff engine 102 may be configured to allow users interacting with the graphical user interface 104 via the keyboard 112 and the mouse 114 to generate takeoff objects containing information used to perform the quantity takeoff, such as the unit cost of construction materials, and takeoff reports detailing the estimated cost of the project. Also as shown, the graphical user interface 104 provides takeoff measurement tools 118 and takeoff reporting tools 120. The takeoff measurement tools 118 may include takeoff object manipulation tools, instance search tools, and takeoff graphical command tools. The takeoff reporting tools 120 may be used to generate and display a takeoff report on the display device 116.

In one embodiment, the system database 106 may include information, such as drawing information and the unit cost of labor, shared among multiple CAD projects. Similarly, the project database 108 may also include drawing information and takeoff calculations, but it may also include project-specific data, such as project cost.

The composition of a given design project may be reflected in a collection of one or more CAD drawings 110. Illustratively, CAD drawing 110 includes a three-dimensional (3D) model 122 and one or more two-dimensional (2D) sheets 124. The 3D model 122 may represent virtually any real-world construct, for example, a construction plan for a building. In such a case, the 3D model 122 may include detailed 3D geometry representing the building, each floor of the building, and different systems for the building (e.g., electrical systems, HVAC systems, etc.). The 2D sheets 124 may be derived from the 3D model 122 and provide different views of the 3D model 122, such as plan, profile, and section views of the project. In one embodiment, the quantity takeoff engine 102 may be configured to use and generate information in the system database 106, the project database 108, and the CAD drawing 110. Accordingly, the quantity take off engine 102 and the graphical user interface 104 may include programmed routines or instructions allowing users to create, edit, load, and save elements from system database 106, the project database 108, and/or the CAD drawing 110. In the context of the present invention, for example, the graphical user interface 104 may allow users to create, edit, load, and save takeoff objects and takeoff reports. Those skilled in the art will recognize, however, that the components shown in FIG. 1 are simplified to highlight aspects of the present invention and that the graphical user interface 104 may include a broad variety of additional tools and features used to compose and manage the system database 106, the project database 108, and the CAD drawing 110.

Figure 2:
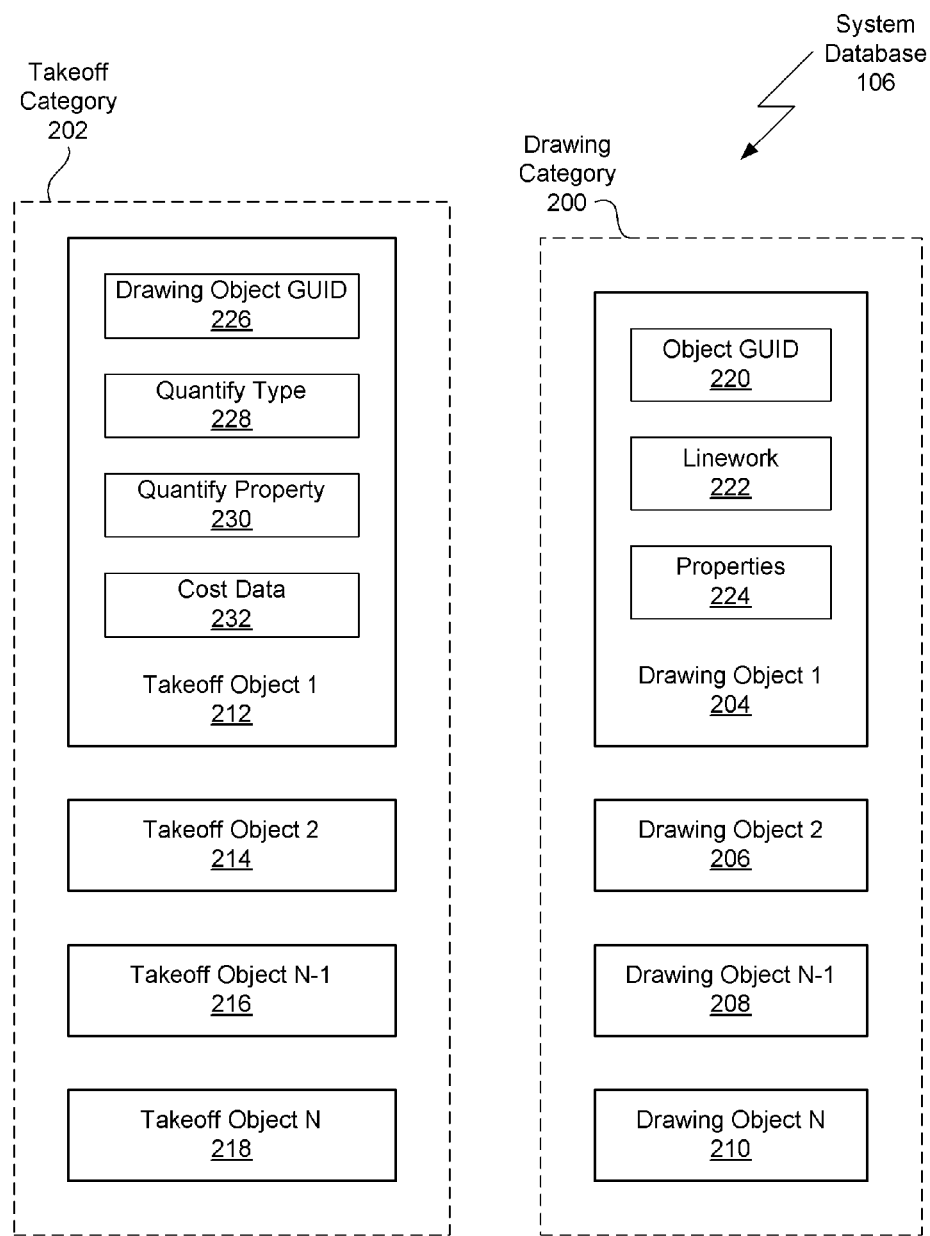
FIG. 2 is a conceptual illustration of elements of the system database of FIG. 1, according to one embodiment of the invention.

FIG. 2 is a conceptual illustration of elements in the system database 106 of FIG. 1, according to one embodiment of the invention. As shown, the system database 106 includes a drawing category 200 and a takeoff category 202. As described below, the drawing category 200 and the takeoff category 202 are used to organize data within the system database 106. Those skilled in the art will recognize, however, that the components shown in FIG. 2 are simplified to highlight aspects of the present invention and that the system database 106 may include a wide variety of organizational structures and data.

As shown, the drawing category 200 includes a drawing object 1 204, a drawing object 2 206, a drawing object N−1 208, and a drawing object N 210. Each of the drawing objects 204, 206, 208, and 210 may be created, edited, and used by various CAD tools, including the quantity takeoff engine 102 and the graphical user interface 104 of FIG. 1. Furthermore, each of the drawing objects 204, 206, 208, and 210 may define an abstract template from which specific instances, or entities, may be created. For example, the drawing object 1 200 may define a toilet object and the CAD drawing 110 of FIG. 1 may contain numerous instances of toilets, each of which inherits some data from the toilet object designated by drawing object 1 200. This hierarchy simplifies changes and ensures consistency throughout a construction project.

Illustratively, the drawing object 1 200 includes a globally unique identifier (GUID) 220, linework 222, and properties 224. The GUID 220 uniquely identifies the drawing object 1 200 to the quantity takeoff engine 102, the graphical interface 104, and any other associated CAD tools in the computer system 100 of FIG. 1. That is GUID 220 may be used to represent a common class of drawing objects in CAD drawing 110. Furthermore, GUID values may be used by other constructs, such as takeoff objects and instances of drawing object 1 200. The linework 222 may define shapes, such as points, lines, and curves that may be displayed by the graphical user interface 104. For example, the linework 222 could provide the shapes required to display a toilet in 3D views or in 2D profile, plan, or section views generated from the CAD drawing 110. The properties 224 may further define how CAD tools interact with the object 1 200 and any instances of object 1 200. The properties 224 may define metadata about a given drawing object such as width, height, weight, etc. Each of the drawing objects 206, 208, and 210 may include similar information, representing different objects that may be included in the CAD drawing 110.

The takeoff category 202 includes a takeoff object 1 212, a takeoff object 2 214, a takeoff object N−1 216, and a takeoff object N 218. The takeoff category 202 may correspond to a standard organizational system, such as CSI-16 or Uniformat. Each of the takeoff objects 212, 214, 216, and 218 may correspond to a drawing object, such as drawing object 1 200, and may be created, edited, and used by various CAD tools, including the quantity takeoff engine 102 and the graphical user interface 104. For example, a takeoff object, such as takeoff object 1 212, corresponding to a toilet drawing object may be created, added to the takeoff category 202 for plumbing fixtures, and subsequently used for quantity takeoff.

As shown, the takeoff object 1 212 includes a drawing object GUID 226, a quantify type 228, a quantify property 230, and cost data 232. During a quantity takeoff process, the drawing object GUID 226 may be used to identify a particular drawing object and a corresponding set of instances to which the data in takeoff object 1 212 may be applied. The quantify type 228, the quantify property 230, and the cost data 232 may then be used to estimate the cost of each of the instances associated with the takeoff object 1 212. In one embodiment, the quantify type 228 defines the type of enumeration, such as count, linear, or area, that is used to calculate the cost of each instance. And the quantify property 230 may define an instance-specific property, such as a length or a volume, corresponding to the quantify type 228. In other words, the quantify property 230 defines how the cost of a collection of instances of a given drawing element should be quantified for a takeoff report. The cost data 232 may include numerical constants, such as labor cost per unit, as well as takeoff equations used to estimate cost.

For example, the takeoff object 1 212 may be created to correspond to the drawing object of a toilet. In this example, the drawing object GUID 226 of the takeoff object 1 212 may be identical to the object GUID 220 of the drawing object corresponding to the toilet, thereby indicating that the information in the takeoff object 1 212 may be applied to all instances of the drawing object (i.e., instances of the toilet) in a given CAD drawing 110. In this case, the quantify type 228 may be set to count, indicating that the quantity to measure during takeoff is simply the number of instances of the drawing object corresponding to the toilet. Furthermore, the cost per toilet may be specified in the cost data 232. The information in takeoff object 1 212, when applied to the CAD drawing 1110, allows all instances of the toilet in CAD drawing 1 110 to be counted and the total cost of the toilets to be added to the total cost for the project represented by CAD drawing 1 110.

Figure 3:
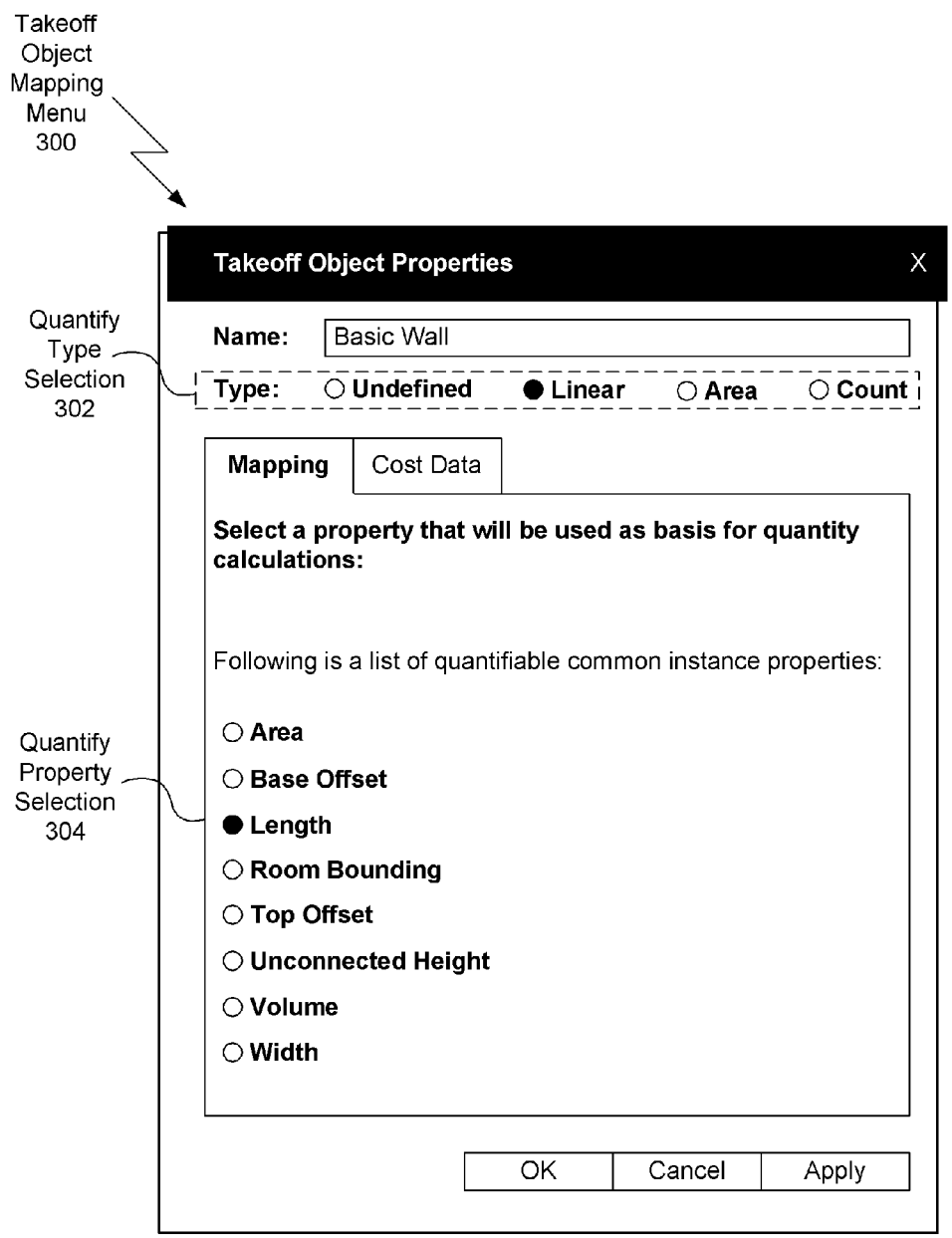
FIG. 3 illustrates an exemplary takeoff object mapping menu, according to one embodiment of the invention.
Figure 4:
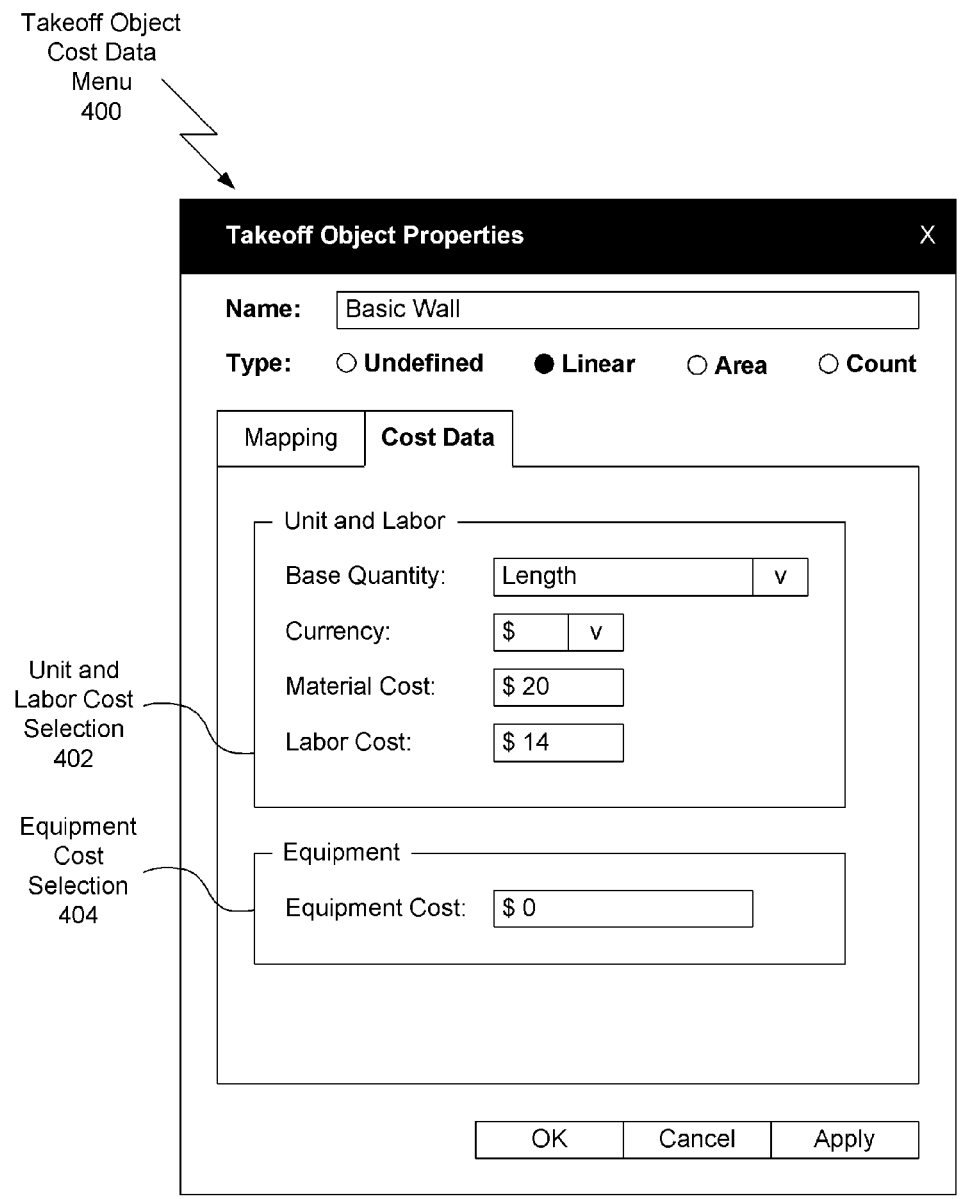
FIG. 4 illustrates an exemplary takeoff object cost data menu, according to one embodiment of the invention.

FIGS. 3 and 4 show an exemplary graphical interface for defining and viewing takeoff object properties. As shown, there are two selectable tabs: cost data and mapping. In FIG. 3, the cost data tab is selected and in FIG. 4 the mapping tab is selected.

FIG. 3 illustrates an exemplary takeoff object mapping menu 300, according to one embodiment of the invention. The takeoff object mapping menu 300 may be configured to allow the user to enter and to view the quantify type 228 and the quantify property 230 of each of the takeoff objects 212, 214, 216, and 218 of FIG. 2.

As shown, the takeoff object mapping menu 300 for a "basic wall" includes a quantify type selection 302 and a quantify property selection 304. The quantify type selection 302 corresponds to the quantify type 228 of a given takeoff object. In this example, the quantify type 228 may be one of unidentified, linear, area, or count. In the takeoff object mapping menu 300 shown in FIG. 3, the quantify property selection 304 is configured to present a list of instance-specific properties. The selected instance property corresponds to the quantify property 230 of a given takeoff object. Illustratively, length is selected, thus, when the quantity takeoff engine 102 performs quantity takeoff on the CAD drawing 110, the length property of the instances of the drawing object representing a "basic wall" may be the basis of a cost estimate for the instances of a "basic wall" present in the CAD drawing 110.

FIG. 4 illustrates an exemplary takeoff object cost data menu 400, according to one embodiment of the invention. The takeoff object cost data menu 400 may be configured to allow the user to enter and view the cost data 232 for each of the takeoff objects 212, 214, 216, and 218 of FIG. 2.

As shown, the takeoff object cost data menu 400 includes a unit and labor cost selection 402 and an equipment cost selection 404. In one embodiment, the unit and labor cost selection 402 may be configured to allow the user to view and specify items relating to the costs of material and labor, such as the currency, unit, material cost per unit, and labor cost per unit. Similarly, the equipment cost selection 404 allows the user to view and specify the cost of any associated equipment using the currency specified in the unit and labor cost menu 402.

Illustratively, in this example, cost data is shown for a takeoff object of "basic wall". As shown, the base quantity to be measured is length, the currency is dollars, the material cost per unit of length is $20, the labor cost per unit of length is $14, and the equipment cost is $0.

Figure 5:
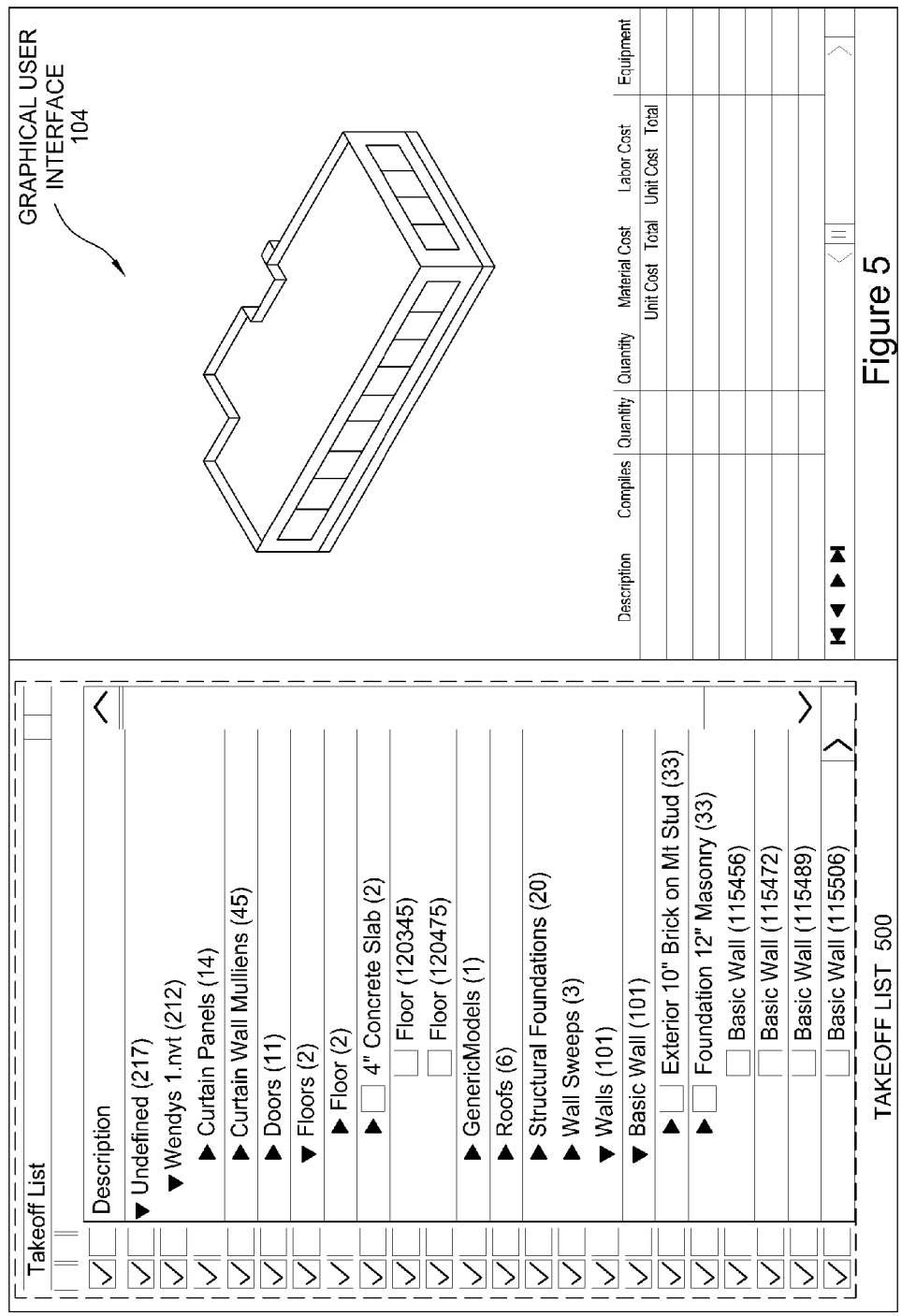
FIG. 5 illustrates an exemplary screen display of the graphical user interface of FIG. 1, according to one embodiment of the invention.

FIG. 5 illustrates an exemplary screen display of the graphical user interface 104 of FIG. 1, according to one embodiment of the invention. More specifically, the screen display in FIG. 5 illustrates a takeoff list 500. As shown, the takeoff list 500 includes takeoff categories, such as the takeoff category 202 of FIG. 2; takeoff objects, such as takeoff object 2 04 of FIG. 2; and the instances in the CAD drawing 110 of FIG. 1 that are associated with each of the takeoff objects. The takeoff list 500 facilitates user-interaction with the takeoff measurement tools 118 of FIG. 1, the takeoff reporting tools 120 of FIG. 1, and the quantity takeoff engine 102 of FIG. 1.

Illustratively, in this example takeoff is being performed on a specific instance of the takeoff object for a "basic wall". Alternatively, as also shown in the menu options in this example, the user may execute "select all instances" before executing takeoff and, thereby, perform takeoff on all instances of a "basic wall" simultaneously.

Figure 6:
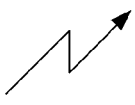
FIG. 6 illustrates an exemplary takeoff report, according to one embodiment of the invention.

FIG. 6 illustrates an exemplary takeoff report 600, according to one embodiment of the invention. Using the takeoff reporting tools 120 of FIG. 1, the takeoff report 600 may be configured to display the takeoff data in a variety of forms. As shown, the takeoff report 600 is configured to include a description 602, a quantity 604, a material cost 606, a labor cost 608, an equipment cost 610, and a total cost 612.

Also as shown, the column under description 602 includes takeoff objects and associated instances. For each item shown under the description 602 heading, the quantity 602, the material cost 604, the labor cost 608, the equipment cost 610, and the total cost 612 is displayed. Furthermore, the material cost 610 is configured to show both the cost per unit of the material and the total cost of the material. Similarly, the labor cost 608 is configured to show both the unit cost of labor and the total cost of labor.

In the specific takeoff report 600 illustrated in FIG. 6, the description column indicates that the quantity takeoff engine 102 has performed takeoff on the "basic wall" and the "door #1" takeoff objects. Furthermore, the description column shows that the quantity take off engine 102 has identified four instances corresponding to the "basic wall" takeoff object and one instance corresponding to the "door #1" takeoff object. As can be seen in the square corresponding to the quantity column of the "basic wall" row, the total quantity used to calculate the cost of the four instances of the "basic wall" is 18.97 meters. Similarly, the total quantity used to calculate the cost of the one instance of "door #1" is 1 each. The total cost column shows a total cost of $569.10 for the four instances of "basic wall", a total cost of $48.00 for the one instance of "door #1", and a cumulative project total cost of $617.10.

Figure 7:
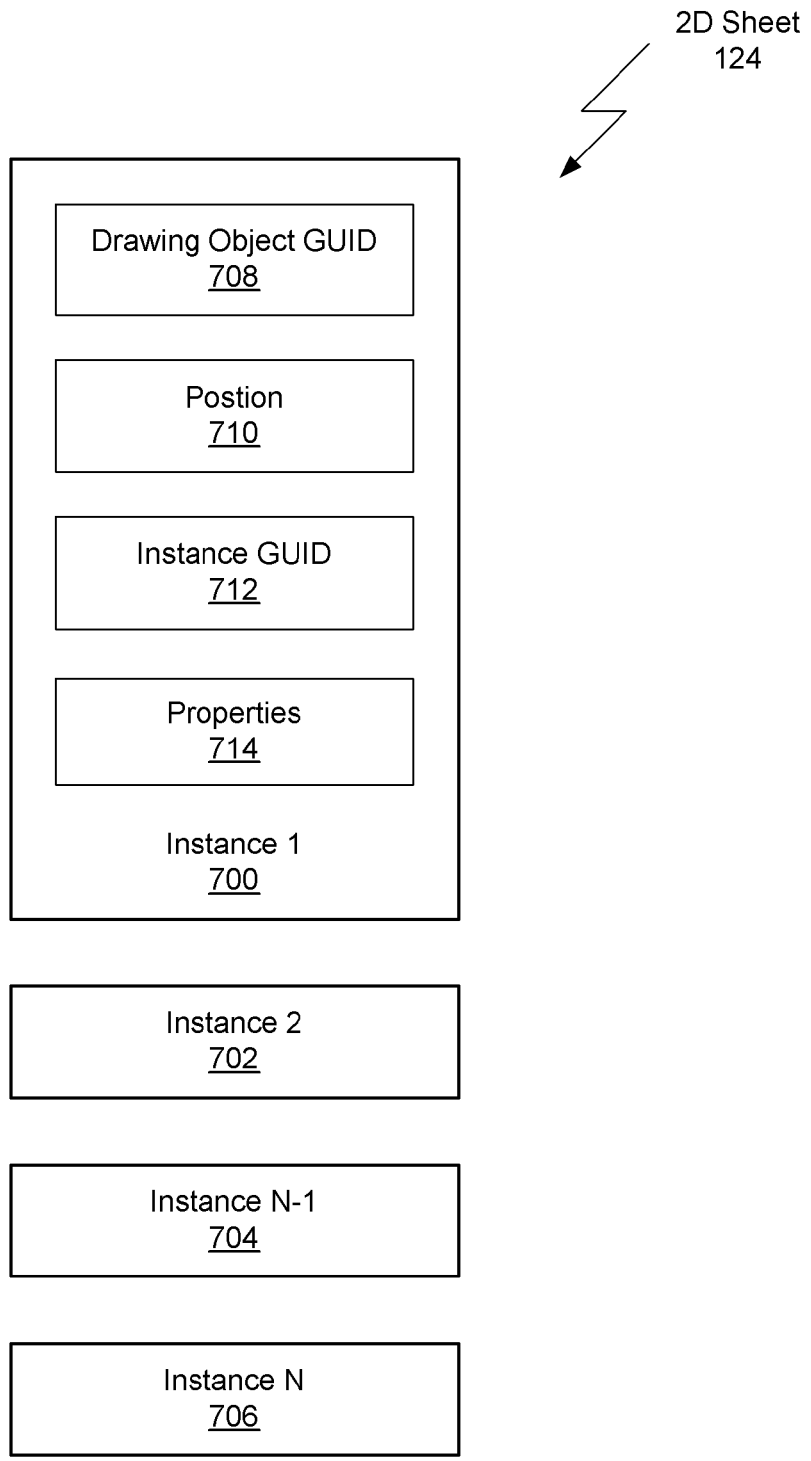
FIG. 7 is a conceptual illustration of a 2D CAD drawing sheet, according to one embodiment of the invention.

FIG. 7 illustrates an example of one of the 2D sheets 124 of FIG. 1, according to one embodiment of the invention. As shown, the 2D sheet 124 includes an instance 1 700 of a drawing object, an instance 2 702 of a drawing object, an instance N−1 704 of a drawing object, and an instance N 706 of a drawing object. Each of the instances 700, 702, 704, and 706 correspond to a drawing object, such as drawing object 1 204 of FIG. 2. Each drawing object may be defined in the system database 106 of FIG. 1, the project database 108 of FIG. 1, or the CAD drawing 110 of FIG. 1.

The instance 1 700 is configured to include a drawing object GUID 708, a position 710, an instance GUID 712, and properties 714. The instance 1 700 may inherit data from the drawing object designated by the drawing object GUID 708. For example, if the drawing object corresponding to the drawing object GUID 708 defines a door, instance 1 700 will inherit the linework 222 and the properties 224 that define this door. The position 710 specifies the location of the instance 1 700 relative to other instances, such as the instance N 706, included in the CAD drawing 110. For example, the position 710 may specify a 3D coordinate location within a space represented by the 2D sheet 124. The instance GUID 712 uniquely identifies the instance 1 700 to the quantity takeoff engine 102, the graphical interface 104, and any other associated CAD tools in the computer system 100 of FIG. 1. While instance 1 700 and instance 2 702 may share the same drawing object GUID 708, thereby indicating that they are both instances of the same drawing object, instance 1 700 and instance 2 702 have different instance GUIDs 712. The properties 714 include information that is specific to each instance, as opposed to information that is shared between instances of the same object. For example, one of the properties 714 such as length or width may be used as the basis for quantifying the instance 1 700 during a quantity takeoff process. Each of the instances 702, 705, and 706 may include similar information.

Figure 8:
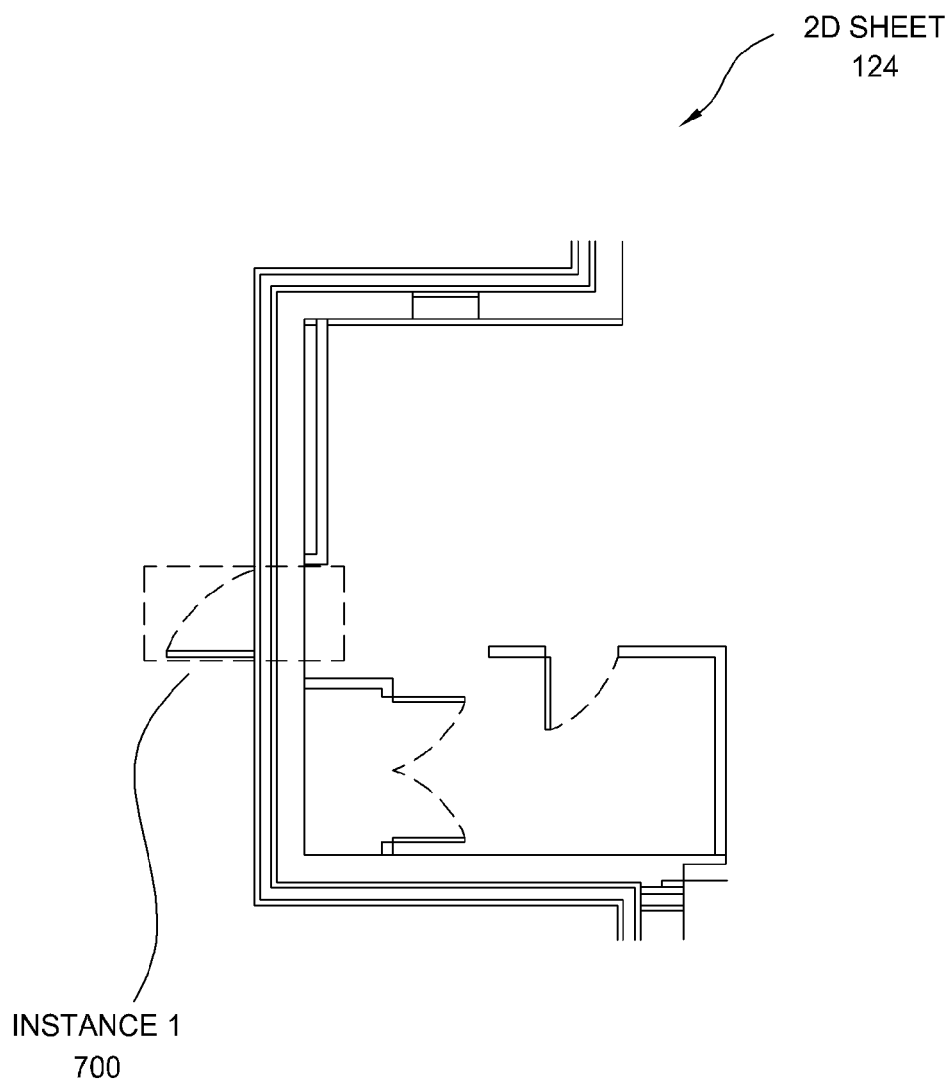
FIG. 8 illustrates a screen display of an exemplary 2D CAD drawing sheet, according to one embodiment of the invention.

FIG. 8 illustrates a screen display of an exemplary 2D sheet of FIG. 1 according to one embodiment of the invention. As shown, the screen display includes a visual representation of the instance 1 700 of FIG. 7. In this example, the appearance of the instance 1 700 indicates that it is a door. The graphical user interface 104 of FIG. 1 may be configured to allow the user to interact with the visual representation of the CAD drawing 110 of FIG. 1 and, thus, the instances contained within the CAD drawing 110.

Figure 9:
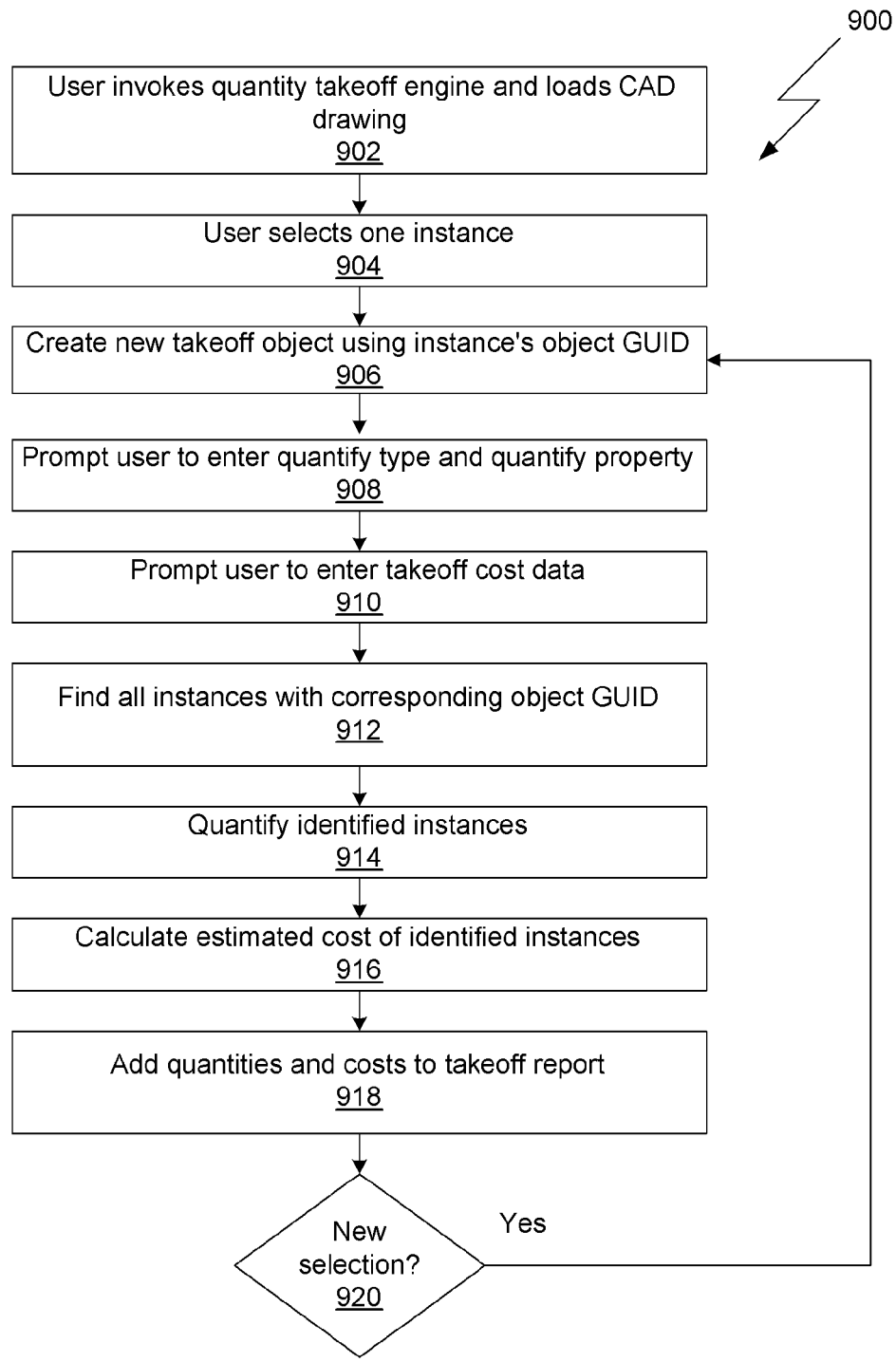
FIG. 9 is a flow diagram illustrating a method for generating a takeoff report, according to one embodiment of the invention.

FIG. 9 is a flow diagram of a method 900 for generating the takeoff report 600 of FIG. 6, according to one embodiment of the invention. Although the method 900 is described in conjunction with the systems of FIGS. 1-8, persons skilled in the art will understand that any system that performs the steps of the method 900, in any order, is within the scope of the invention.

As shown, the method 900 begins at step 902, where the user invokes the quantity takeoff engine 102 and loads the CAD drawing 110. In step 904, the user selects an instance of a drawing object from the CAD drawing 110. In step 906, a new takeoff object is created to represent takeoff data for the drawing object selected in step 904. In one embodiment, the new takeoff object may include the drawing object GUID 226. The GUID 226 may be copied from the particular instance of a drawing object GUID 708 selected at step 904, thereby creating the association between the takeoff object and the drawing object, based on the instance of a drawing object by the user.

In step 908, the takeoff object mapping menu 300 is displayed and the user may enter values for the quantify type 228 and the quantify property 230. In step 910, the takeoff object cost data menu 400 is displayed and the user may enter takeoff cost information, such as the cost data 232. In step 912, the quantity takeoff engine 102 may parse the CAD drawing 110 to identify all drawing objects in which the drawing object GUID 708 matches the drawing object GUID 226 of the takeoff object defined in steps 906-910. In other words, the quantity takeoff engine 102 may identify all objects in the CAD drawing 110 of a common type, as represented by object GUID 708.

In step 914, the takeoff measurement tools 118 and the quantity takeoff engine 102 may use the quantify type 228 and the quantify property 230 to quantify each of the instances identified at step 912. In one embodiment, each such instance may be marked as being part of a common takeoff group. That is, the quantity takeoff engine 102 may determine the appropriate takeoff quantities for the collection of drawing object instances identified at step 912. For example, for a door object, the quantity may be a simple count of the number of instances of the door object in the drawing. Of course, more complicated takeoff calculations may be performed. For example, for a wall object, the takeoff engine 102 may evaluate instances of the wall object in CAD drawing 110 to determine a combined linear length of all such walls.

In step 916, the quantities determined at step 914 are used in conjunction with the cost data 232 to estimate the cost of the identified instances. For example, for a simple numerical count quantity takeoff calculation, the number of identified instances may simply be multiplied by the unit cost for the material and labor, as specified in the takeoff object, to determine the total cost of the instances. In step 918, the takeoff reporting tools 120 may add the quantities measured in step 914 and the costs calculated in step 916 to the takeoff report 600. At step 920, the user may select another instance in a CAD drawing to be the basis of another takeoff object. In such a case, the method 900 returns to step 906, where a new takeoff object is created. The user may continue in this manner to create as many new takeoff objects as desired.

The method 900 may be useful where a user desires to incrementally build a takeoff report by iteratively selecting the linework for an instance of each drawing object. However selecting linework may become tedious and the user may desire to use a more structured selection method. Accordingly, in one embodiment, the quantity takeoff engine 102 may be configured to identify a collection of drawing objects in the CAD drawing 110 and to generate corresponding takeoff objects for each identified drawing object.

Figure 10:
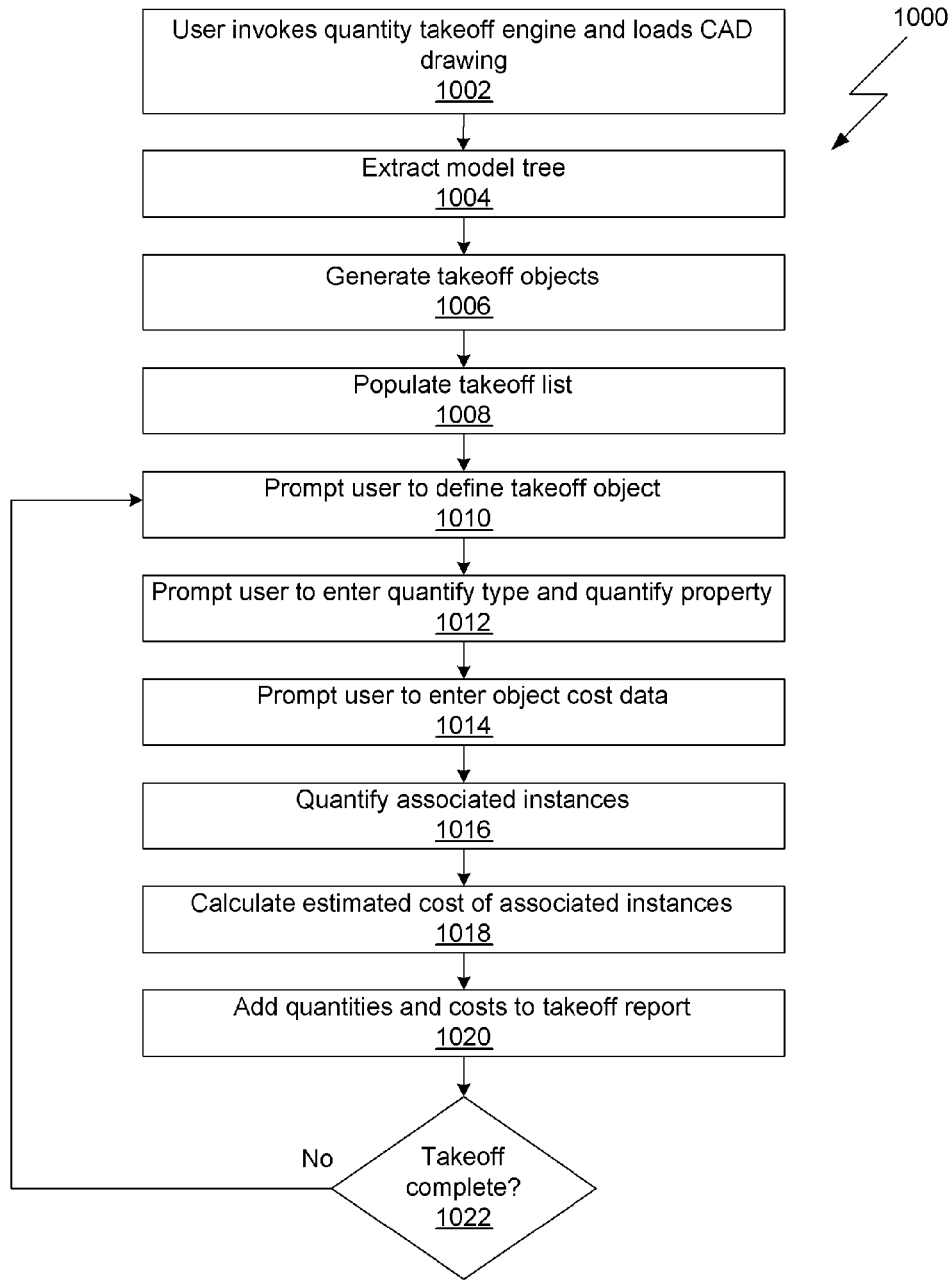
FIG. 10 is a flow diagram illustrating another method for generating a takeoff report, according to another embodiment of the invention.

FIG. 10 is a flow diagram illustrating a method 1000 steps for generating the takeoff report 600 of FIG. 6, according to one embodiment of the invention. Method 1000 uses information from the CAD drawing 110 of FIG. 1 to automate more of the takeoff process. Although method 1000 is described in conjunction with the systems of FIGS. 1-8, persons skilled in the art will understand that any system that performs the method 1000, in any order, is within the scope of the invention.

As shown, the method 1000 begins at step 1002, where the user invokes the quantity takeoff engine 102 and loads the CAD drawing 110. In step 1004, the quantity takeoff engine 102 may generate a model tree of drawing objects and instances from the CAD drawing 110. The model tree stores drawing objects and instances of drawing objects. In one embodiment, instances of a drawing object in the CAD drawing 110 that share a common drawing object GUID 708 may be grouped together in the model tree. In step 1006, a takeoff object is created for each distinct drawing object in the model tree. In one embodiment, each takeoff object includes the drawing object GUID 226. Advantageously, the groupings in the model tree are preserved, thus each takeoff object may also include a reference to each instance of a drawing object that corresponds to the drawing object GUID 226. In step 1008, the model tree is used to populate the takeoff list 500 with the takeoff objects and their associated instances. For example, FIG. 5 illustrates an example of a takeoff list 500 that may be displayed using the graphical user interface 104.

In step 1010, the user may specify properties for a takeoff object for one of the entries in the takeoff list. Accordingly, in step 1012, the takeoff object mapping menu 300 is displayed and the user enters the quantify type 228 and the quantify property 230 for a given takeoff object. In step 1014, the takeoff object cost data menu 400 is displayed allowing the user to enter takeoff cost information, such as the cost data 232.

In step 1016, the takeoff measurement tools 118 and the quantity takeoff engine 102 use the quantify type 228 and the quantify property 230 to quantify each of the instances associated with the selected takeoff object. That is, at step 1016, the instances of the drawing object associated with the selected takeoff object are evaluated to generate the appropriate takeoff quantities for a set of instances in the CAD drawing 110. In step 1018, the quantity takeoff engine 102 evaluates these quantities along with the cost data 232 to estimate the cost for each of the instances of the drawing object in the CAD drawing 110. In step 1020, the takeoff reporting tools 120 may add the quantities measured in step 1016 and the costs calculated in step 1018 to the takeoff report 600. At step 1022, the quantity takeoff engine 102 analyzes the takeoff tree to determine if the cost estimate is complete. If there are additional instances of drawing objects that have not been quantified, the method returns to step 1010, where the user defines another takeoff object from the takeoff object list. The method 1000 continues in this fashion until each takeoff object in the takeoff tree has been defined and processed, thereby generating the takeoff report 600 and, thus, a cost estimate representing the entire project.

The method 1000 may be useful where a user desires to incrementally build a takeoff report. However a user may prefer to generate a complete takeoff report using a single command. Furthermore, a user may wish to share takeoff objects between construction projects.

Figure 11:
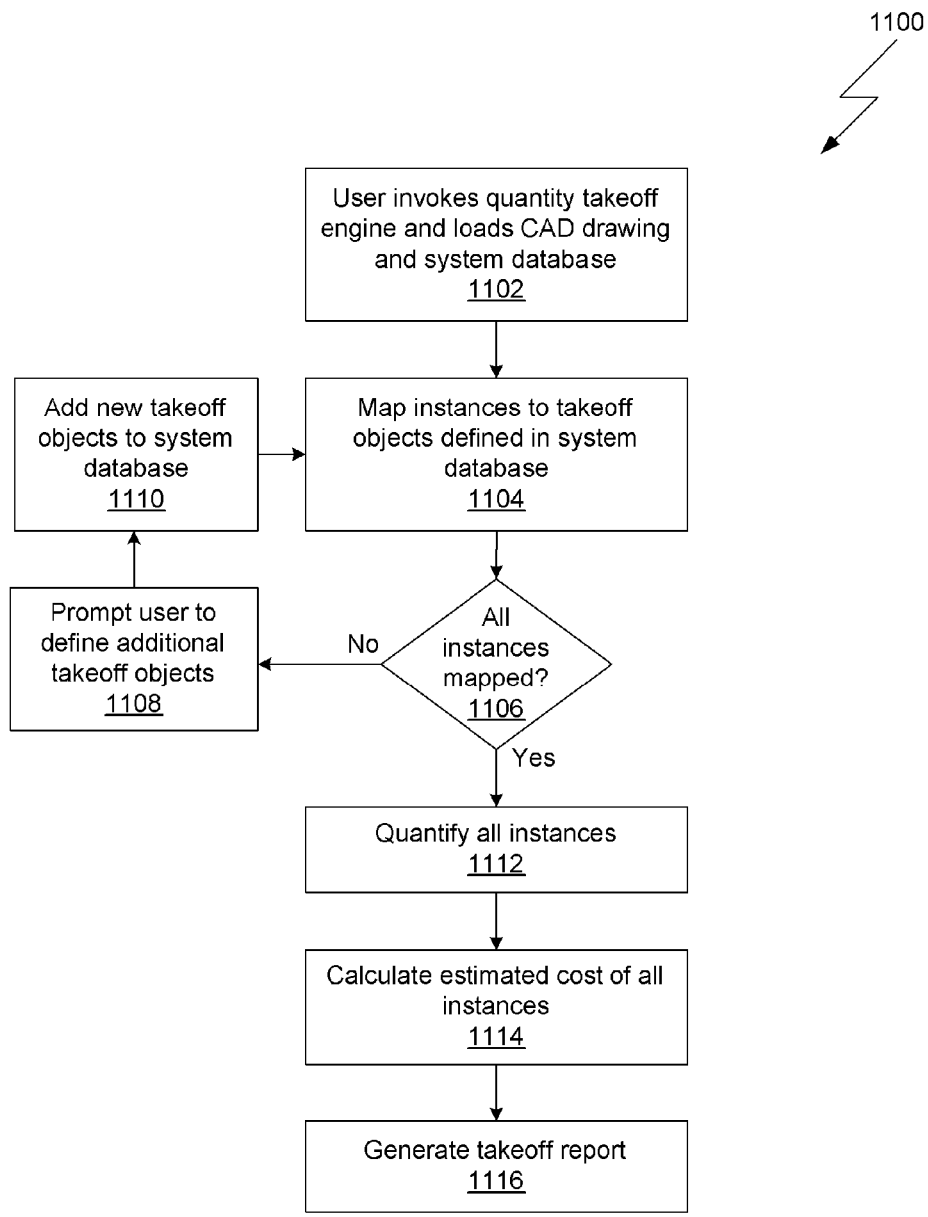
FIG. 11 is a flow diagram illustrating another method for generating a takeoff report and further for adding new takeoff objects to the system database, according to another embodiment of the invention.

FIG. 11 is a flow diagram of method steps for generating the takeoff report 600 of FIG. 6 and adding new takeoff objects to the system database 106 of FIG. 1, according to one embodiment of the invention. Storing takeoff objects in the system database 106 allows takeoff objects to be shared among multiple projects, thereby increasing takeoff consistency between the projects. For example, an architectural firm may wish to reuse takeoff objects defined for elements of a given CAD drawing across multiple drawing projects. Doing so avoids having to recreate this data from scratch each time. In one embodiment, the system database may be used to store take off objects used for reuse in multiple design projects. Although the method steps are described in conjunction with the systems of FIGS. 1-8, persons skilled in the art will understand that any system that performs the method steps, in any order, is within the scope of the invention.

As shown, the method 1100 begins at step 1102, where the user invokes the quantity take off engine 102, loads the CAD drawing 110, and loads the system database 106. In step 1104, the quality takeoff engine 102 attempts to map instances of drawing objects in the CAD drawing 110 to the takeoff objects defined in the system database 106. For example, the quantity takeoff engine 102 may be configured to match the drawing object GUID 708 for a given instance to the drawing object GUID 226 of the takeoff objects. At step 1106, the CAD drawing 110 is analyzed to determine if all the instances have been mapped to takeoff objects. If all the instances have been mapped, the method 1100 skips steps 1108-1110 and continues at step 1112, where the instances are quantified, according to the matching takeoff object associated with a given instance of a drawing object.

In step 1108, the quantity takeoff engine may be configured to prompt the user to define additional takeoff objects for instances of drawing objects that were not matched to a takeoff object at step 1104. For example, in one embodiment, new takeoff objects may be defined according to steps 904-910 of the method 900 illustrated in FIG. 9. In step 1110, the system database 106 is updated with the takeoff objects created in step 1108. The method 1100 then returns to step 1104, where all instances of drawing objects in the CAD drawing 110 are mapped to takeoff objects defined in the system database 106. As persons skilled in the art will recognize, step 1104 may be performed in an incremental fashion, such that only unmapped instances and new takeoff objects are considered during the mapping process. Again, at step 1106, if all instances of drawing objects are mapped to takeoff objects, the flow continues at step 1112. Otherwise, method 1100 may continue to loop through steps 1108, 1110, 1104, and 1106 until all instances of drawing objects in a given CAD drawing are mapped to takeoff objects.

In step 1112, the takeoff measurement tools 118 and the quantity takeoff engine 102 use the quantify type 228 and the quantify property 230 to quantify each of the instances of drawing objects in CAD drawing 110. In step 1114, the quantity takeoff engine 102 evaluates these quantities along with the cost data 232 to estimate the cost for each instance of each drawing object in the CAD drawing. In step 1116, the takeoff reporting tools 120 generate the takeoff report 600 from the quantities measured in step 1112 and the costs calculated in step 1114. The takeoff report 600 generated in this flow includes the total estimated cost of the project defined in the CAD drawing 110.

In sum, the data contained in CAD drawings may be used to automate portions of the takeoff process used to generate estimated costs for a construction project. Typically, a CAD drawing contains abstract drawing objects from which concrete instances may be derived. Each instance may include instance-specific information that may be supplemented with information inherited from the associated abstract drawing object. This hierarchical approach simplifies the CAD drawing. In a similar fashion, much of the information required to perform takeoff calculations, such as material cost, may be consolidated into abstract takeoff objects. Typically, data in the takeoff object may include a mapping method, such as using an object GUID, to identify instances of a drawing object associated with the takeoff object; the quantify type, such as count, linear, or area; the instance-specific property, such as length or volume, to be quantified; and takeoff cost information, such as material cost per unit of the quantify property. The quantity takeoff engine and the graphical user interface may be configured to interact with these takeoff objects to automate some of the steps in takeoff process. Advantageously, consolidating takeoff information and automating steps in the takeoff process reduce both the likelihood of errors and the time required to perform quantity takeoff. Furthermore, reducing the time required to perform quantity takeoff facilitates quickly and accurately assessing the cost impact of different design choices.

In a first embodiment, the user selects an instance and defines an associated takeoff object. The quantity takeoff engine is configured to use the information in this takeoff object to identify all associated instances in the CAD drawing, quantify these instances, calculate the cost of these instances, and add the quantities and costs to the takeoff report. The user may continue to select instances until all instances in the project have been quantified, thereby generating an estimate for the total project cost. Advantageously, the takeoff measurement tools automatically quantify each instance, thereby increasing the accuracy of the measurements as compared to manual techniques, such as using a digitizer. Moreover, the takeoff calculations, such as labor cost equations, are also performed automatically, further reducing the likelihood of errors in the project cost estimate.

In a second embodiment, the information in the CAD drawing is used to create a takeoff tree of undefined takeoff objects and associated instances. Every instance in the CAD drawing is included in the takeoff tree. The quantity takeoff engine evaluates the takeoff tree and prompts the user to define takeoff objects until all of the takeoff objects have been defined. After each takeoff object is defined, the quantity takeoff engine applies the information in the takeoff object to the associated instances in the takeoff tree to generate quantity and cost information for the associated instances. These quantities and costs are added to the takeoff report. Thus, when all takeoff objects have been defined, the takeoff report includes the quantity and cost of each instance in the CAD drawing. In addition to the advantages of the first embodiment, this embodiment also ensures that all instances are quantified. For example, in the first embodiment, it is possible for the user to neglect to select an instance, resulting in an inaccurate project cost estimate. In this embodiment, the user is prompted if any takeoff objects are undefined, thereby ensuring a complete project cost estimate.

In a third embodiment, the quantity takeoff engine is configured to interact with a system database that may contain takeoff objects. The quantity takeoff engine evaluates each instance in the CAD drawing and attempts to map each instance to a corresponding takeoff object in the system database. If there are any instances that are not mapped to a takeoff object, the user is prompted to define additional takeoff objects. The new takeoff objects are added to the system database and the quantity takeoff engine attempts to map the previously unmapped instances to the newly defined takeoff objects. When all instances are successfully mapped, the information in the takeoff objects is used to quantify each instance and subsequently calculate the cost of each instance. These quantities and costs are used to generate a takeoff report for the entire CAD drawing, and thereby a complete estimate of project cost. Advantageously, utilizing the system database in this fashion allows takeoff objects to be shared amongst projects, thereby increasing consistency between projects. Furthermore, as projects are completed, the system database increases in capability. Over time, the creation of new takeoff objects decreases as the system database becomes more complete, thereby reducing the time required to perform takeoff.

While the foregoing is directed to embodiments of the present invention, other and further embodiments of the invention may be devised without departing from the basic scope thereof, and the scope thereof is determined by the claims that follow.

What is claimed is:

1. A method for generating cost estimates from a computer-aided design (CAD) drawing that represents a design project, the method comprising:
   receiving a selection of an instance of a drawing object in the CAD drawing;
   generating, for the selected drawing object, a takeoff object, wherein the takeoff object is configured to store a quantify type, a quantify property, and cost data used to generate a cost estimate for the design project based on instances of the selected drawing object in the CAD drawing;
   receiving values for each of the quantify type, the quantify property, and the cost data;
   receiving a selection of a takeoff category to be associated with the takeoff object, wherein the takeoff category is associated with one or more additional takeoff objects according to data stored in a database;

parsing the CAD drawing to identify a total number of instances of the selected drawing object, the CAD drawing comprising a plurality of different types of drawing objects, each type of drawing object identified by a different object globally unique identifier (GUID), the selected drawing object being identified by a first object GUID for a first type of drawing object, and wherein parsing comprises determining a total number of instances of drawing objects in the CAD drawing having an object GUID matching the first object GUID;

quantifying, based on the values for the quantify type and the quantify property, a takeoff quantity for the identified instances of the selected drawing object;

computing, from the takeoff quantity and the cost data, a cost estimate for the instances of the selected drawing object;

storing the values for the quantify type, the quantify property, and the cost data in the takeoff object; and generating a hierarchical takeoff report based on the takeoff object, wherein the hierarchical takeoff report displays, as sub-elements to the takeoff category, the values for the quantify type, the quantify property, the cost data and the cost estimate for each of the identified instances of the selected drawing object.

2. The method of claim 1, wherein the quantify type is one of a numerical count, a linear count, an area computation, or a volumetric computation, specifying how the instances of the selected drawing object should by quantified.

3. A non-transitory computer-readable storage medium storing instructions that when executed by a processor cause the processor to perform an operation for generating cost estimates for a design project from a computer-aided design (CAD) drawing representing the design project, by performing steps of:

receiving a selection of an instance of a drawing object in the CAD drawing;

generating, for the selected drawing object, a takeoff object, wherein the takeoff object is configured to store a quantify type, a quantify property, and cost data used to generate a cost estimate for the design project based on instances of the selected drawing object in the CAD drawing;

receiving values for each of the quantify type, the quantify property, and the cost data;

receiving a selection of a takeoff category to be associated with the takeoff object, wherein the takeoff category is associated with one or more additional takeoff objects according to data stored in a database;

parsing the CAD drawing to identify a total number of instances of the selected drawing object, the CAD drawing comprising a plurality of different types of drawing objects, each type of drawing object identified by a different object globally unique identifier (GUID), the selected drawing object being identified by a first object GUID for a first type of drawing object, and wherein parsing comprises determining a total number of instances of drawing objects in the CAD drawing having an object GUID matching the first object GUID;

quantifying, based on the values for the quantify type and the quantify property, a takeoff quantity for the identified instances of the selected drawing object;

computing, from the takeoff quantity and the cost data, a cost estimate for the instances of the selected drawing object;

storing the values for the quantify type, the quantify property, and the cost data in the takeoff object; and generating a hierarchical takeoff report based on the takeoff object, wherein the hierarchical takeoff report displays, as sub-elements to the takeoff category, the values for the quantify type, the quantify property, the cost data and the cost estimate for each of the identified instances of the selected drawing object; and displaying the takeoff report.

4. The non-transitory computer-readable storage medium of claim 3, wherein the quantify type is one of a numerical count, a linear count, an area computation, or a volumetric computation, specifying how the instances of the selected drawing object should by quantified.

5. A method for generating cost estimates for a design project from a computer-aided design (CAD) drawing representing the design project, the method comprising:

specifying a selection of an instance of a drawing object in the CAD drawing; and invoking a quantity takeoff tool configured to:

receive a selection of an instance of a drawing object in the CAD drawing;

generate, for the selected drawing object, a takeoff object, wherein the takeoff object is configured to store a quantify type, a quantify property, and cost data used to generate a cost estimate for the design project based on instances of the selected drawing object in the CAD drawing;

receive values for each of the quantify type, the quantify property, and the cost data;

receive a selection of a takeoff category to be associated with the takeoff object, wherein the takeoff category is associated with one or more additional takeoff objects according to data stored in a database;

parse the CAD drawing to identify a total number of instances of the selected drawing object, the CAD drawing comprising a plurality of different types of drawing objects, each type of drawing object identified by a different object globally unique identifier (GUID), the selected drawing object being identified by a first object GUID for a first type of drawing object, and the takeoff tool is configured to parse by determining a total number of instances of drawing objects in the CAD drawing having an object GUID matching the first object GUID;

quantify, based on the values for the quantify type and the quantify property, a takeoff quantity for the identified instances of the selected drawing object;

compute, from the takeoff quantity and the cost data, a cost estimate for the instances of the selected drawing object;

store the values for the quantify type, the quantify property, and the cost data in the takeoff object; and generate a hierarchical takeoff report based on the takeoff object, wherein the hierarchical takeoff report displays, as sub-elements to the takeoff category, the values for the quantify type, the quantify property, the cost data and the cost estimate for each of the identified instances of the selected drawing object; and display the takeoff report.

6. The method of claim 5, wherein the quantify type is one of a numerical count, a linear count, an area computation, or a volumetric computation, specifying how the instances of the selected drawing object should by quantified.

7. The method of claim 1, wherein the takeoff report further includes a total cost estimate for the takeoff category that is equal to a sum of the cost estimates for each of the identified instances of the selected drawing object.

8. The non-transitory computer-readable storage medium of claim 3, wherein the takeoff report further includes a total cost estimate for the takeoff category that is equal to a sum of the cost estimates for each of the identified instances of the selected drawing object.

9. The method of claim 5, wherein the takeoff report further includes a total cost estimate for the takeoff category that is equal to a sum of the cost estimates for each of the identified instances of the selected drawing object.

10. The method of claim 1, wherein:
the first type of drawing object identified by the first object GUID comprises object properties; and
each instance of the selected drawing object comprises the first object GUID, an instance GUID that uniquely identifies the instance, and instance properties comprising at least some properties unique to the instance and at least some properties inherited from the object properties of the first type of drawing object that are common to all instances of the selected drawing object.

11. The method of claim 1, wherein the takeoff object is further configured to store the first object GUID of the selected drawing object indicating that the information in the takeoff object is applied to all instances of the selected drawing object having the first object GUID.

12. The non-transitory computer-readable storage medium of claim 3, wherein:
the first type of drawing object identified by the first object GUID comprises object properties; and
each instance of the selected drawing object comprises the first object GUID, an instance GUID that uniquely identifies the instance, and instance properties comprising at least some properties unique to the instance and at least some properties inherited from the object properties of the first type of drawing object that are common to all instances of the selected drawing object.

13. The non-transitory computer-readable storage medium of claim 3, wherein the takeoff object is further configured to store the first object GUID of the selected drawing object indicating that the information in the takeoff object is applied to all instances of the selected drawing object having the first object GUID.

14. The method of claim 5, wherein:
the first type of drawing object identified by the first object GUID comprises object properties; and
each instance of the selected drawing object comprises the first object GUID, an instance GUID that uniquely identifies the instance, and instance properties comprising at least some properties unique to the instance and at least some properties inherited from the object properties of the first type of drawing object that are common to all instances of the selected drawing object.

15. The method of claim 5, wherein the takeoff object is further configured to store the first object GUID of the selected drawing object indicating that the information in the takeoff object is applied to all instances of the selected drawing object having the first object GUID.

* * * * *